United States Patent
Shin et al.

(10) Patent No.: US 10,026,471 B2
(45) Date of Patent: Jul. 17, 2018

(54) SYSTEM-ON-CHIP AND ELECTRONIC DEVICE HAVING THE SAME

(71) Applicant: SAMSUNG ELECTRONICS CO., LTD., Suwon-si (KR)

(72) Inventors: In-Sub Shin, Suwon-si (KR); Jae-Han Jeon, Seoul (KR); Hyung-Ock Kim, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/009,149

(22) Filed: Jan. 28, 2016

(65) Prior Publication Data

US 2016/0322097 A1 Nov. 3, 2016

(30) Foreign Application Priority Data

Apr. 29, 2015 (KR) .................. 10-2015-0060403

(51) Int. Cl.
*G11C 5/14* (2006.01)
*G11C 11/417* (2006.01)
*G11C 7/10* (2006.01)

(52) U.S. Cl.
CPC .............. *G11C 11/417* (2013.01); *G11C 5/14* (2013.01); *G11C 7/1006* (2013.01); *G11C 5/148* (2013.01)

(58) Field of Classification Search
CPC ....... G11C 11/417; G11C 5/14; G11C 7/1006; G11C 5/148
USPC ........................................... 365/154
See application file for complete search history.

(56) References Cited

U.S. PATENT DOCUMENTS

| 7,982,535 B2 | 7/2011 | Kim et al. | |
| 2008/0284504 A1* | 11/2008 | Hirota | H03K 19/0016 327/544 |
| 2015/0280703 A1* | 10/2015 | Jeon | H03K 17/165 327/382 |
| 2016/0149573 A1* | 5/2016 | Maehashi | H03K 19/177 326/103 |

* cited by examiner

*Primary Examiner* — Anthan Tran
(74) *Attorney, Agent, or Firm* — Sughrue Mion, PLLC

(57) ABSTRACT

A system-on-chip and an electronic device including the system-on-chip are provided. The system-on-chip includes a power switch, a logic block, a memory device, and a buffer. The power switch is coupled between a first power supply line and a virtual power supply line, and turns on in response to a switch control signal. The logic block is coupled between the virtual power supply line and a ground line. The memory device is coupled between a second power supply line and the ground line. The buffer is coupled between the second power supply line and the ground line, and generates the switch control signal based on a sleep signal.

19 Claims, 8 Drawing Sheets

SYSTEM-ON-CHIP AND ELECTRONIC DEVICE HAVING THE SAME

CROSS-REFERENCE TO RELATED APPLICATION(S)

This application claims priority from Korean Patent Application No. 10-2015-0060403, filed on Apr. 29, 2015 in the Korean Intellectual Property Office, the contents of which are herein incorporated by reference in their entirety.

BACKGROUND

1. Technical Field

Apparatuses, systems, and articles of manufacture consistent with the present disclosure relate to a system-on-chip, and more particularly to a system-on-chip including a power gating circuit.

2. Description of the Related Art

Generally, a mobile device operates using a battery. Therefore, if a power consumption of a system-on-chip included in the mobile device decrease, an operation time of the mobile device may increase.

For this reason, a power gating circuit is widely used in a system-on-chip to reduce power consumption. The power gating circuit reduces power consumption of a system-on-chip by cutting off a power supply from a logic block in a sleep mode.

However, in a related art power gating circuit, a leakage current may flow through a power cut-off switch even in the sleep mode, such that power is consumed in the sleep mode.

SUMMARY

One or more exemplary embodiments provide a system-on-chip that effectively reduces power consumption in a sleep mode.

One or more exemplary embodiments also provide an electronic device including the system-on-chip.

According to an aspect of an exemplary embodiment, there is provided a system-on-chip that includes a power switch, a logic block, a memory device, and a buffer. The power switch is coupled between a first power supply line and a virtual power supply line, and turns on in response to a switch control signal. The logic block is coupled between the virtual power supply line and a ground line. The memory device is coupled between a second power supply line and the ground line. The buffer is coupled between the second power supply line and the ground line, and generates the switch control signal based on a sleep signal.

A first power supply voltage may be applied to the first power supply line, and a second power supply voltage that is higher than the first power supply voltage may be applied to the second power supply line.

The buffer may provide the second power supply voltage to the power switch as the switch control signal when the sleep signal has a first logic level.

The power switch may selectively couple the first power supply line to the virtual power supply line in response to the switch control signal.

The power switch may include a first p-type metal oxide semiconductor (PMOS) transistor including a source coupled to the first power supply line, a drain coupled to the virtual power supply line, and a gate receiving the switch control signal.

The buffer may include a second PMOS transistor including a source coupled to the second power supply line, a drain coupled to the gate of the first PMOS transistor, and a gate, a first n-type metal oxide semiconductor (NMOS) transistor including a source coupled to the ground line, a drain coupled to the gate of the first PMOS transistor, and a gate, a third PMOS transistor including a source coupled to the second power supply line, a drain coupled to the gate of the second PMOS transistor and the gate of the first NMOS transistor, and a gate receiving the sleep signal, and a second NMOS transistor including a source coupled to the ground line, a drain coupled to the gate of the second PMOS transistor and the gate of the first NMOS transistor, and a gate receiving the sleep signal.

The memory device may be a static random access memory (SRAM) device.

The memory device may include an SRAM cell array coupled between the second power supply line and the ground line, and operating using a voltage provided through the second power supply line, and a peripheral circuit coupled between the first power supply line and the ground line, and controlling an operation of the SRAM cell array using a voltage provided through the first power supply line.

The system-on-chip may further include a power controller configured to provide the sleep signal having a first logic level to the buffer in a sleep mode in which the logic block is deactivated, and to provide the sleep signal having a second logic level to the buffer in a normal operation mode in which the logic block is activated.

According to an aspect of another exemplary embodiment exemplary embodiment, there is provided an electronic device that includes a power management integrated circuit, and a system-on-chip. The power management integrated circuit applies a first power supply voltage to a first power supply line, applies a second power supply voltage to a second power supply line, applies a ground voltage to a ground line, and adjusts at least one of a magnitude of the first power supply voltage and a magnitude of the second power supply voltage based on a power control signal. The system-on-chip is coupled to the power management integrated circuit through the first power supply line, the second power supply line, and the ground line. The system-on-chip includes a power switch, a logic block, a memory device, a power controller, and a buffer. The power switch is coupled between the first power supply line and a virtual power supply line, and turns on in response to a switch control signal. The logic block is coupled between the virtual power supply line and the ground line. The memory device is coupled between the second power supply line and the ground line. The power controller generates the power control signal and a sleep signal based on an operation mode of the logic block. The buffer is coupled between the second power supply line and the ground line, and generates the switch control signal based on the sleep signal.

The power controller may generate the power control signal having a first value and generate the sleep signal having a first logic level in a sleep mode, in which the logic block is deactivated, and adjust a value of the power control signal and generate the sleep signal having a second logic level in a normal operation mode, in which the logic block is activated.

Based on the power control signal, the power management integrated circuit may control a voltage level of the first power supply voltage to be lower than a voltage level of the second power supply voltage in the sleep mode.

Based on the power control signal, the power management integrated circuit may control a voltage level of the first power supply voltage in the sleep mode to be lower than a voltage level of the first power supply voltage in the normal operation mode.

The buffer may provide the second power supply voltage to the power switch as the switch control signal when the sleep signal has the first logic level.

The system-on-chip may further include a non-volatile memory that stores a first voltage level and a second voltage level that is higher than the first voltage level. The power controller may provide the first voltage level and the second voltage level, which are read from the non-volatile memory, to the power management integrated circuit in the sleep mode. The power management integrated circuit may set the first power supply voltage to the first voltage level and set the second power supply voltage to the second voltage level in the sleep mode.

The system-on-chip may further include a non-volatile memory configured to store first information and second information. The power controller may provide the first information and the second information, which are read from the non-volatile memory, to the power management integrated circuit in the sleep mode. The power management integrated circuit may set the first power supply voltage based on the first information and may set the second power supply voltage based on the second information in the sleep mode.

The first information may be a first code and the second information may be a second code.

The first information may be a first voltage and the second information may be a second voltage. The power management integrated circuit may set the first power supply voltage by multiplying the first voltage by a first multiplier, and may set the second power supply voltage by multiplying the second voltage by a second multiplier.

The first information and the second information may be determined based on a leakage current of the power switch and a leakage current of the buffer in the sleep mode.

The first voltage level and the second voltage level may be determined based on a leakage current of the power switch and a leakage current of the buffer in the sleep mode.

The first voltage level and the second voltage level may be determined based on a leakage current of the power switch and a leakage current of the buffer in the sleep mode.

The non-volatile memory may include a one time programmable (OTP) memory.

The power controller may adjust the value of the power control signal using software based on a task performed by the logic block.

The power switch may selectively couple the first power supply line to the virtual power supply line in response to the switch control signal.

The power switch may include a first p-type metal oxide semiconductor (PMOS) transistor including a source coupled to the first power supply line, a drain coupled to the virtual power supply line, and a gate receiving the switch control signal.

The buffer may include a second PMOS transistor including a source coupled to the second power supply line, a drain coupled to the gate of the first PMOS transistor, and a gate, a first n-type metal oxide semiconductor (NMOS) transistor including a source coupled to the ground line, a drain coupled to the gate of the first PMOS transistor, and a gate, a third PMOS transistor including a source coupled to the second power supply line, a drain coupled to the gate of the second PMOS transistor and the gate of the first NMOS transistor, and a gate receiving the sleep signal, and a second NMOS transistor including a source coupled to the ground line, a drain coupled to the gate of the second PMOS transistor and the gate of the first NMOS transistor, and a gate receiving the sleep signal.

The memory device may be a static random access memory (SRAM) device.

The memory device may include an SRAM cell array coupled between the second power supply line and the ground line, and operating using a voltage provided through the second power supply line, and a peripheral circuit coupled between the first power supply line and the ground line, and controlling an operation of the SRAM cell array using a voltage provided through the first power supply line.

According to an aspect of another exemplary embodiment, there is provided a computing system that includes a storage device, a power management integrated circuit, a system-on-chip, and a display device. The storage device stores multimedia data. The power management integrated circuit applies a first power supply voltage to a first power supply line, applies a second power supply voltage to a second power supply line, applies a ground voltage to a ground line, and adjusts at least one of a magnitude of the first power supply voltage and a magnitude of the second power supply voltage based on a power control signal. The system-on-chip is coupled to the power management integrated circuit through the first power supply line, the second power supply line, and the ground line, and generates video data based on the multimedia data. The display device displays the video data. The system-on-chip includes a power switch, a logic block, a memory device, a power controller, and a buffer. The power switch is coupled between the first power supply line and a virtual power supply line, and turns on in response to a switch control signal. The logic block is coupled between the virtual power supply line and the ground line. The memory device is coupled between the second power supply line and the ground line. The power controller generates the power control signal and a sleep signal based on an operation mode of the logic block. The buffer is coupled between the second power supply line and the ground line, and generates the switch control signal based on the sleep signal.

According to an aspect of another exemplary embodiment, there is provided a system-on-chip comprising a power switch, a logic block, and a buffer. The power switch comprises a transistor having a source coupled to a first power supply line supplying a first power supply voltage, a drain coupled to a second power supply line supplying a second power supply voltage, and a gate. The logic block is coupled between the second power supply line and a ground line supplying a ground voltage. The buffer is configured to forward bias the transistor of the power switch to supply power to the logic block in a normal mode, and to reverse bias the transistor of the power switch to disable the supply of power to the logic block in a sleep mode.

The buffer may forward bias the transistor by applying a ground voltage to the gate of the transistor.

The buffer may reverse bias the transistor by applying a voltage higher than the first power supply voltage to the gate of the transistor

BRIEF DESCRIPTION OF THE DRAWINGS

Illustrative, non-limiting exemplary embodiments will be more clearly understood from the following detailed description in conjunction with the accompanying drawings, in which.

DETAILED DESCRIPTION

Figure 1:
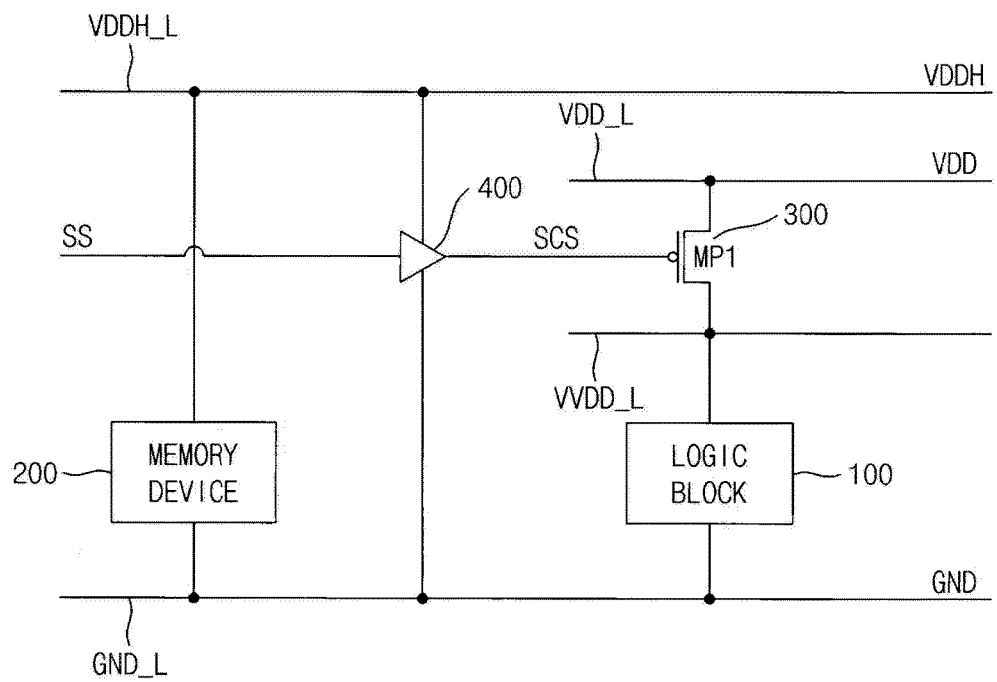
FIG. 1 is a block diagram illustrating a system-on-chip according to exemplary embodiments.

Various exemplary embodiments will be described more fully with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this disclosure will be thorough and complete, and will fully convey the scope of the present inventive concept to those skilled in the art. Like reference numerals refer to like elements throughout this application.

It will be understood that, although the terms "first", "second", etc. may be used herein to describe various elements, these elements should not be limited by these terms. These terms are used to distinguish one element from another. For example, a "first" element could be termed a "second" element, and, similarly, a "second" element could be termed a "first" element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a system-on-chip according to exemplary embodiments.

A system-on-chip 10 of FIG. 1 may be, for example, an application processor, a media processor, a microprocessor, a central processing unit (CPU), etc.

Referring to FIG. 1, the system-on-chip 10 includes a logic block 100, a memory device 200, a power switch 300, and a buffer 400.

The power switch 300 is coupled between a first power supply line VDD_L and a virtual power supply line VVDD_L. The power switch 300 may be turned on in response to a switch control signal SCS.

The logic block 100 is coupled between the virtual power supply line VVDD_L and a ground line GND_L.

The memory device 200 is coupled between a second power supply line VDDH_L and the ground line GND_L. In some exemplary embodiments, the memory device 200 may be a static random access memory (SRAM) device.

The buffer 400 is coupled between the second power supply line VDDH_L and the ground line GND_L. The buffer 400 may generate the switch control signal SCS based on a sleep signal SS. For example, the buffer 400 may generate the switch control signal SCS by buffering the sleep signal SS.

A first power supply voltage VDD may be applied to the first power supply line VDD_L, and a second power supply voltage VDDH higher than the first power supply voltage VDD may be applied to the second power supply line VDDH_L. A ground voltage GND may be applied to the ground line GND_L. In other words, GND_L=GND, VDD_L=VDD, and VDDH_L=VDDH. The ground voltage GND may be a 0 voltage. Alternatively, in some exemplary embodiments, the ground voltage GND may be non-zero.

In some exemplary embodiments, the buffer 400 may provide the second power supply voltage VDDH to the power switch 300 as the switch control signal SCS when the sleep signal SS has a first logic level, and provide the ground voltage GND to the power switch 300 as the switch control signal SCS when the sleep signal SS has a second logic level.

The power switch 300 may selectively couple the first power supply line VDD_L to the virtual power supply line VVDD_L in response to the switch control signal SCS.

The logic block 100 may selectively receive power from the virtual power supply line VVDD_L. For example, the logic block 100 may receive power from the virtual power supply line VVDD_L while the power switch 300 is turned on such that the first power supply line VDD_L is coupled to the virtual power supply line VVDD_L. On the other hand, the logic block 100 may not receive power from the virtual power supply line VVDD_L while the power switch 300 is turned off such that the first power supply line VDD_L is disconnected from the virtual power supply line VVDD_L.

The logic block 100 may include various kinds of circuits coupled to the virtual power supply line VVDD_L. In some exemplary embodiments, the logic block 100 may include standard cells that are formed by a complementary metal-oxide semiconductor (CMOS) standard cell process. For example, the logic block 100 may include an inverter, a NAND gate, an AND gate, a NOR gate, an OR gate, an XOR gate, an XNOR gate, a multiplexer, an adder, a latch, a flip-flop, etc., which are embodied with the standard cells.

As described above, since the buffer 400 and the power switch 300 selectively couple the first power supply line VDD_L to the virtual power supply line VVDD_L based on a logic level of the sleep signal SS, the buffer 400 and the power switch 300 may operate as a power gating circuit that selectively provides power to the logic block 100 based on the logic level of the sleep signal SS.

In some exemplary embodiments, the power switch 300 may include a first p-type metal oxide semiconductor (PMOS) transistor MP1 including a source coupled to the first power supply line VDD_L, a drain coupled to the virtual power supply line VVDD_L, and a gate receiving the switch control signal SCS. Although FIG. 1 illustrates that the power switch 300 includes one PMOS transistor MP1 coupled between the first power supply line VDD_L and the virtual power supply line VVDD_L, the power switch 300 may include more than one PMOS transistor coupled between the first power supply line VDD_L and the virtual power supply line VVDD_L.

The sleep signal SS may have the first logic level in a sleep mode in which the logic block 100 is deactivated, and have the second logic level in a normal operation mode (i.e., a non-sleep mode) in which the logic block 100 is activated.

In the normal operation mode, the buffer 400 may provide the ground voltage GND to the gate of the first PMOS transistor MP1 as the switch control signal SCS to forward bias the first PMOS transistor MP1. Therefore, the first PMOS transistor MP1 may be turned on to couple the first power supply line VDD_L to the virtual power supply line VVDD_L. As such, the logic block 100 may receive power from the first power supply line VDD_L to perform a normal operation.

In the sleep mode, the buffer 400 may provide the second power supply voltage VDDH to the gate of the first PMOS transistor MP1 as the switch control signal SCS to reverse bias the first PMOS transistor MP1. Therefore, the first PMOS transistor MP1 may be turned off to disconnect the first power supply line VDD_L from the virtual power supply line VVDD_L. As such, the logic block 100 may enter in the sleep mode.

Generally, a leakage current (e.g., a sub-threshold leakage current) may flow through a PMOS transistor although the PMOS transistor is turned off. In the turned off state, a magnitude of the leakage current may increase as a voltage difference between a gate and a source of the PMOS transistor decreases.

In a related art power gating circuit, a power supply voltage is applied to both a gate and a source of a power switch in a sleep mode. In this case, although the power switch is turned off to electrically disconnect a power supply line from a virtual power supply line, a leakage current may flow through the power switch.

For example, in a hypothetical case in which the switch control signal SCS has the first power supply voltage VDD in the sleep mode, a voltage difference between the gate and the source of the first PMOS transistor MP1 may be substantially zero. Therefore, although the first PMOS transistor MP1 is turned off, a minute leakage current may flow in the first PMOS transistor MP1. In such a hypothetical case, since the leakage current flows from the first power supply line VDD_L to the logic block 100 through the first PMOS transistor MP1 in the sleep mode, the logic block 100 may consume power even in the sleep mode.

On the other hand, as described above, in the system-on-chip 10 according to exemplary embodiments, the buffer 400 may provide the second power supply voltage VDDH, which is higher than the first power supply voltage VDD, to the gate of the first PMOS transistor MP1 as the switch control signal SCS in the sleep mode. Since the voltage difference between the gate and the source of the first PMOS transistor MP1 corresponds to a voltage difference between the second power supply voltage VDDH and the first power supply voltage VDD, the leakage current of the first PMOS transistor MP1 in the sleep mode may decrease. Therefore, the system-on-chip 10 according to exemplary embodiments may effectively decrease power consumption in the sleep mode.

In addition, since the buffer 400 is coupled to the second power supply line VDDH_L, to which the second power supply voltage VDDH higher than the first power supply voltage VDD is applied, the buffer 400 may provide the second power supply voltage VDDH, which is higher than the first power supply voltage VDD applied to the source of the first PMOS transistor MP1, to the gate of the first PMOS transistor MP1 based on the sleep signal SS without using a separate level shifter. Therefore, the system-on-chip 10 according to exemplary embodiments may be implemented in a relatively small size compared to a system-on-chip including a level shifter.

Figure 2:
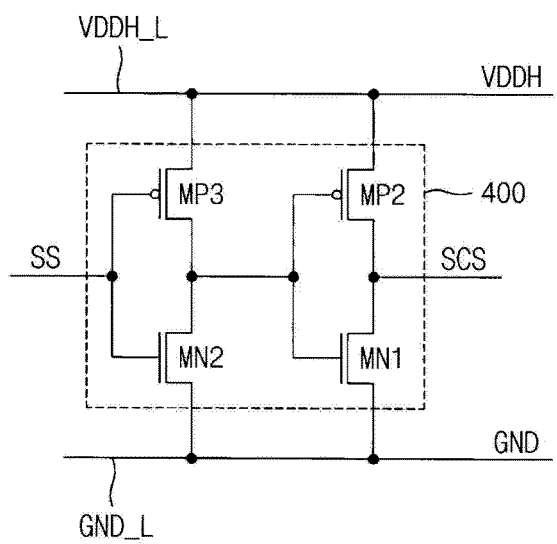
FIG. 2 is a circuit diagram illustrating an example of a buffer included in the system-on-chip of FIG. 1.

FIG. 2 is a circuit diagram illustrating an example of a buffer included in the system-on-chip of FIG. 1.

Referring to FIG. 2, the buffer 400 may include a second PMOS transistor MP2, a third PMOS transistor MP3, a first n-type metal oxide semiconductor (NMOS) transistor MN1, and a second NMOS transistor MN2.

The second PMOS transistor MP2 may include a source coupled to the second power supply line VDDH_L, a drain coupled to the gate of the first PMOS transistor MP1 (see FIG. 1), and a gate coupled to a drain of the third PMOS transistor MP3 and a drain of the second NMOS transistor MN2.

The first NMOS transistor MN1 may include a source coupled to the ground line GND_L, a drain coupled to the gate of the first PMOS transistor MP1 (see FIG. 1), and a gate coupled to the drain of the third PMOS transistor MP3 and the drain of the second NMOS transistor MN2.

The third PMOS transistor MP3 may include a source coupled to the second power supply line VDDH_L, a drain coupled to the gate of the second PMOS transistor MP2 and the gate of the first NMOS transistor MN1 and a drain of the first NMOS transistor MN1, and a gate receiving the sleep signal SS.

The second NMOS transistor MN2 may include a source coupled to the ground line GND_L, a drain coupled to the gate of the second PMOS transistor MP2 and the gate of the first NMOS transistor MN1 and the drain of the third PMOS transistor MP3, and a gate receiving the sleep signal SS.

The buffer 400 may output the switch control signal SCS through the drain of the second PMOS transistor MP2 and the drain of the first NMOS transistor MN1.

As illustrated in the FIG. 2, the second PMOS transistor MP2 and the first NMOS transistor MN1 may operate as a first inverter, and the third PMOS transistor MP3 and the second NMOS transistor MN2 may operate as a second inverter.

Therefore, the buffer 400 may provide the second power supply voltage VDDH to the gate of the first PMOS transistor MP1 as the switch control signal SCS when the sleep signal SS has a logic high level, and provide the ground voltage GND to the gate of the first PMOS transistor MP1 as the switch control signal SCS when the sleep signal SS has a logic low level.

Although FIG. 2 illustrates that the buffer 400 includes two inverters, the buffer 400 may include any number of inverters.

In some exemplary embodiments, a body of the first PMOS transistor MP1, which is included in the power switch 300, and bodies of the second PMOS transistor MP2 and the third PMOS transistor MP3, which are included in the buffer 400, may be commonly coupled to the first power supply line VDD_L. In this case, the second PMOS transistor MP2 and the third PMOS transistor MP3 may be formed on a substrate or a well on which the first PMOS transistor MP1 is formed.

If the body of the first PMOS transistor MP1 is coupled to the first power supply line VDD_L to which the source of the first PMOS transistor MP1 is coupled, and the bodies of the second PMOS transistor MP2 and the third PMOS transistor MP3 are coupled to the second power supply line VDDH_L to which the source of the second PMOS transistor MP2 and the source of the third PMOS transistor MP3 are coupled, a well on which the first PMOS transistor MP1 is formed is required to be separated from a well on which the second PMOS transistor MP2 and the third PMOS transistor MP3 are formed. Therefore, a size of the system-on-chip 10 may increase.

However, as described above, when the body of the first PMOS transistor MP1 and the bodies of the second PMOS transistor MP2 and the third PMOS transistor MP3 are commonly coupled to the first power supply line VDD_L, the first PMOS transistor MP1, the second PMOS transistor MP2, and the third PMOS transistor MP3 may be formed on a same well. Therefore, a size of the system-on-chip 10 may decrease.

In other exemplary embodiments, a body of the first PMOS transistor MP1, which is included in the power switch 300, may be coupled to the first power supply line VDD_L, and bodies of the second PMOS transistor MP2 and the third PMOS transistor MP3, which are included in the buffer 400, may be coupled to the second power supply line VDDH_L. Even in this case, the buffer 400 may provide the second power supply voltage VDDH, which is higher than the first power supply voltage VDD applied to the source of the first PMOS transistor MP1, to the gate of the first PMOS transistor MP1 based on the sleep signal SS without using a separate level shifter. Therefore, the system-on-chip 10 according to exemplary embodiments may be implemented in a relatively small size compared to a system-on-chip including a related art power gating circuit that generates a switch control signal for controlling a power switch using a level shifter.

The buffer 400 illustrated in FIG. 2 is an example of the buffer included in the system-on-chip 10 of FIG. 1, but exemplary embodiments are not limited thereto. The buffer 400 may be implemented in various structures that generate the switch control signal SCS having one of the ground voltage GND and the second power supply voltage VDDH, based on the sleep signal SS.

Figure 3:
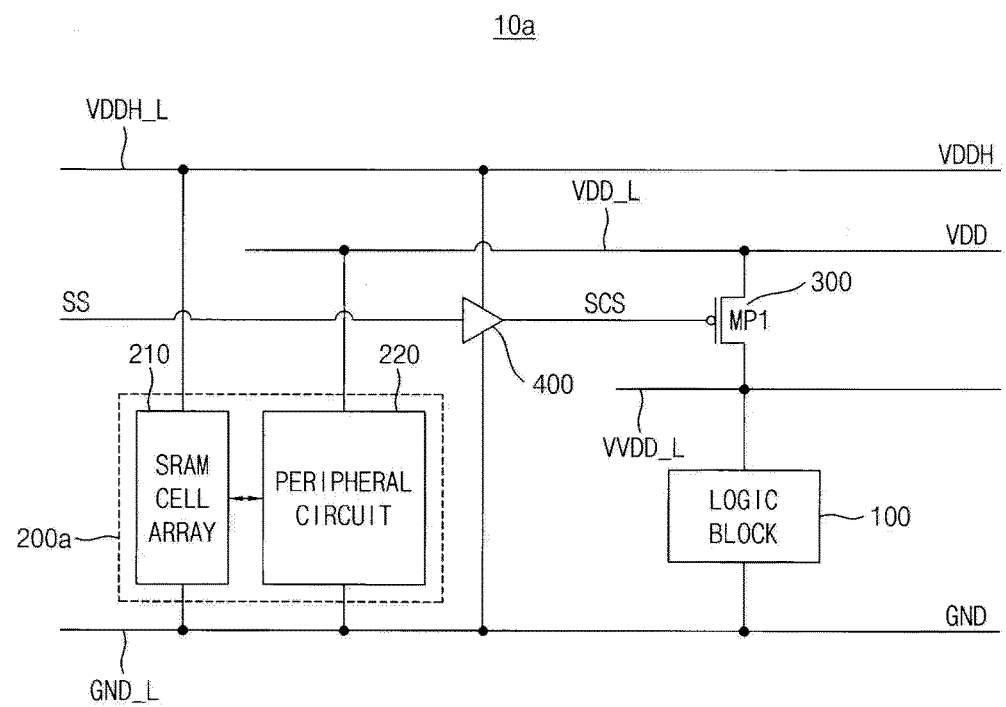
FIG. 3 is a block diagram illustrating another example of the system-on-chip of FIG. 1.

FIG. 3 is a block diagram illustrating another example of the system-on-chip of FIG. 1.

Referring to FIG. 3, a system-on-chip 10a may include a logic block 100, a memory device 200a, a power switch 300, and a buffer 400.

The logic block 100, the power switch 300, and the buffer 400 included in the system-on-chip 10a of FIG. 3 may be the same as the logic block 100, the power switch 300, and the buffer 400 included in the system-on-chip 10 of FIG. 1. Therefore, repeated description thereof will be omitted.

The memory device 200a may include an SRAM cell array 210 and a peripheral circuit PERI 220.

The SRAM cell array 210 may be coupled between the second power supply line VDDH_L and the ground line GND_L. Therefore, the SRAM cell array 210 may operate using the second power supply voltage VDDH provided through the second power supply line VDDH_L.

The SRAM cell array 210 may be coupled to the peripheral circuit 220 through a plurality of word lines, a plurality of bit lines, and a plurality of complementary bit lines. The SRAM cell array 210 may include a plurality of bitcells coupled to the plurality of word lines, the plurality of bit lines, and the plurality of complementary bit lines.

Figure 4:
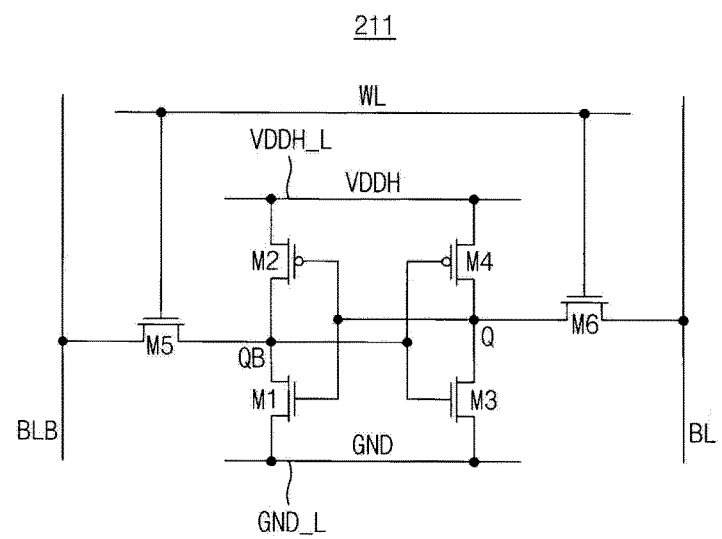
FIG. 4 is a circuit diagram illustrating an example of a bitcell included in a static random access memory (SRAM) cell array of the system-on-chip of FIG. 3.

FIG. 4 is a circuit diagram illustrating an example of a bitcell included in a static random access memory (SRAM) cell array of the system-on-chip of FIG. 3.

Referring to FIG. 4, the bitcell 211 may include first through sixth transistors M1~M6.

The first transistor M1 may include a source coupled to the ground line GND_L, a drain coupled to a first node QB, and a gate coupled to a second node Q.

The second transistor M2 may include a source coupled to the second power supply line VDDH_L, a drain coupled to the first node QB, and a gate coupled to the second node Q.

The third transistor M3 may include a source coupled to the ground line GND_L, a drain coupled to the second node Q, and a gate coupled to the first node QB.

The fourth transistor M4 may include a source coupled to the second power supply line VDDH_L, a drain coupled to the second node Q, and a gate coupled to the first node QB.

The fifth transistor M5 may include a source coupled to a complementary bit line BLB, a drain coupled to the first node QB, and a gate coupled to a word line WL.

The sixth transistor M6 may include a source coupled to a bit line BL, a drain coupled to the second node Q, and a gate coupled to the word line WL.

As illustrated in FIG. 4, since the first through fourth transistors M1~M4 correspond to two inverters that are circularly coupled to each other, a logic level of the first node QB may be complementary to a logic level of the second node Q. A voltage of the first node QB may be transferred to the complementary bit line BLB through the fifth transistor M5, and a voltage of the second node Q may be transferred to the bit line BL through the sixth transistor M6.

The bitcell 211 illustrated in FIG. 4 is an example of the bitcell included in the SRAM cell array 210 of the system-on-chip of FIG. 3, but exemplary embodiments are not limited thereto. The bitcell included in the SRAM cell array 210 may be implemented in various structures that store one bit data.

Referring again to FIG. 3, the peripheral circuit 220 may be coupled between the first power supply line VDD_L and the ground line GND_L. Therefore, the peripheral circuit 220 may operate using the first power supply voltage VDD provided through the first power supply line VDD_L.

The peripheral circuit 220 may control an operation of the SRAM cell array 210 through the plurality of word lines, the plurality of bit lines, and the plurality of complementary bit lines. For example, the peripheral circuit 220 may control a write operation and a read operation of the SRAM cell array 210. In some exemplary embodiments, the peripheral circuit 220 may include a row decoder, a column decoder, a sense amplifier, a data input/output buffer, etc.

Generally, if a voltage level of a power supply voltage that is provided to a semiconductor device decreases, power consumption of the semiconductor device decreases. However, the voltage level of the power supply voltage is required to be greater than a threshold magnitude for the semiconductor device to operate stably. The threshold magnitude may be predetermined. If the voltage level of the power supply voltage is smaller than the threshold magnitude, an error may occur in the operation of the semiconductor device.

In the case of the memory device 200a, the peripheral circuit 220 may operate stably although the power supply voltage is relatively low, but the SRAM cell array 210 may use a relatively high power supply voltage to operate stably. For example, referring to the bitcell 211 of FIG. 4, threshold voltages of the first through fourth transistors M1~M4 may have variations according to manufacturing processes. Therefore, if a voltage level of the second power supply voltage VDDH, which is applied to the second power supply line VDDH_L, decreases such that a voltage difference between the second power supply voltage VDDH and the ground voltage GND decreases, a state of data stored in the bitcell 211 may be changed.

As described above with reference to FIG. 3, in the memory device 200a included in the system-on-chip 10a, the peripheral circuit 220 may be coupled between the first power supply line VDD_L, to which the first power supply voltage VDD is applied, and the ground line GND_L to decrease power consumption, and the SRAM cell array 210 may be coupled between the second power supply line VDDH_L, to which the second power supply voltage VDDH higher than the first power supply voltage VDD is applied, and the ground line GND_L to operate stably.

Therefore, the system-on-chip 10a of FIG. 3 may decrease power consumption while operating stably in the sleep mode.

Figure 5:
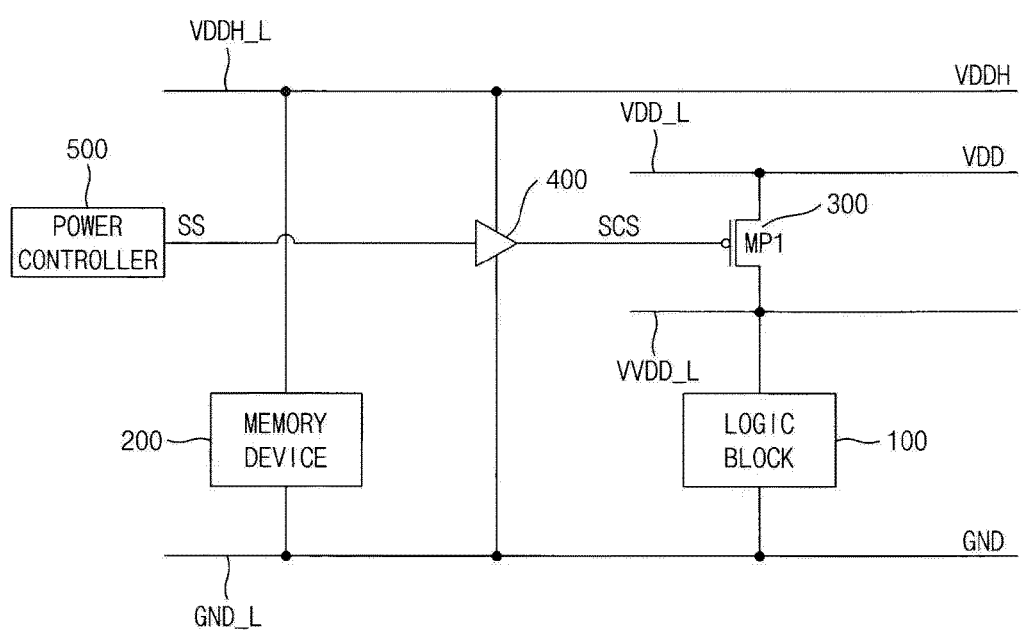
FIG. 5 is a block diagram illustrating another example of the system-on-chip of FIG. 1.

FIG. 5 is a block diagram illustrating another example of the system-on-chip of FIG. 1.

Referring to FIG. 5, a system-on-chip 10b may include a logic block 100, a memory device 200, a power switch 300, a buffer 400, and a power controller PMU 500.

The system-on-chip 10b of FIG. 5 is the same as the system-on-chip 10 of FIG. 1 except that the system-on-chip 10b of FIG. 5 further includes the power controller 500. Therefore, repeated description the components of the system-on-chip 10 will be omitted.

The power controller 500 may provide the sleep signal SS to the buffer 400 to selectively provide power to the logic block 100 based on an operation mode of the logic block 100.

For example, the power controller 500 may provide the sleep signal SS having a first logic level (e.g., a logic high level) to the buffer 400 when an operation of the logic block 100 is finished and the operation of the logic block 100 is not used any more. The buffer 400 may provide the second power supply voltage VDDH to the gate of the first PMOS transistor MP1 as the switch control signal SCS based on the sleep signal SS having the first logic level. Therefore, the first PMOS transistor MP1 may be turned off to disconnect the first power supply line VDD_L from the virtual power supply line VVDD_L. As such, the logic block 100 may enter in the sleep mode.

Alternately, the power controller 500 may provide the sleep signal SS having a second logic level (e.g., a logic low level) to the buffer 400 when an operation of the logic block 100 is used. The buffer 400 may provide the ground voltage GND to the gate of the first PMOS transistor MP1 as the switch control signal SCS based on the sleep signal SS having the second logic level. Therefore, the first PMOS transistor MP1 may be turned on to couple the first power supply line VDD_L to the virtual power supply line VVDD_L. As such, the logic block 100 may enter in the normal operation mode and receive power from the first power supply line VDD_L to perform a normal operation.

Figure 6:
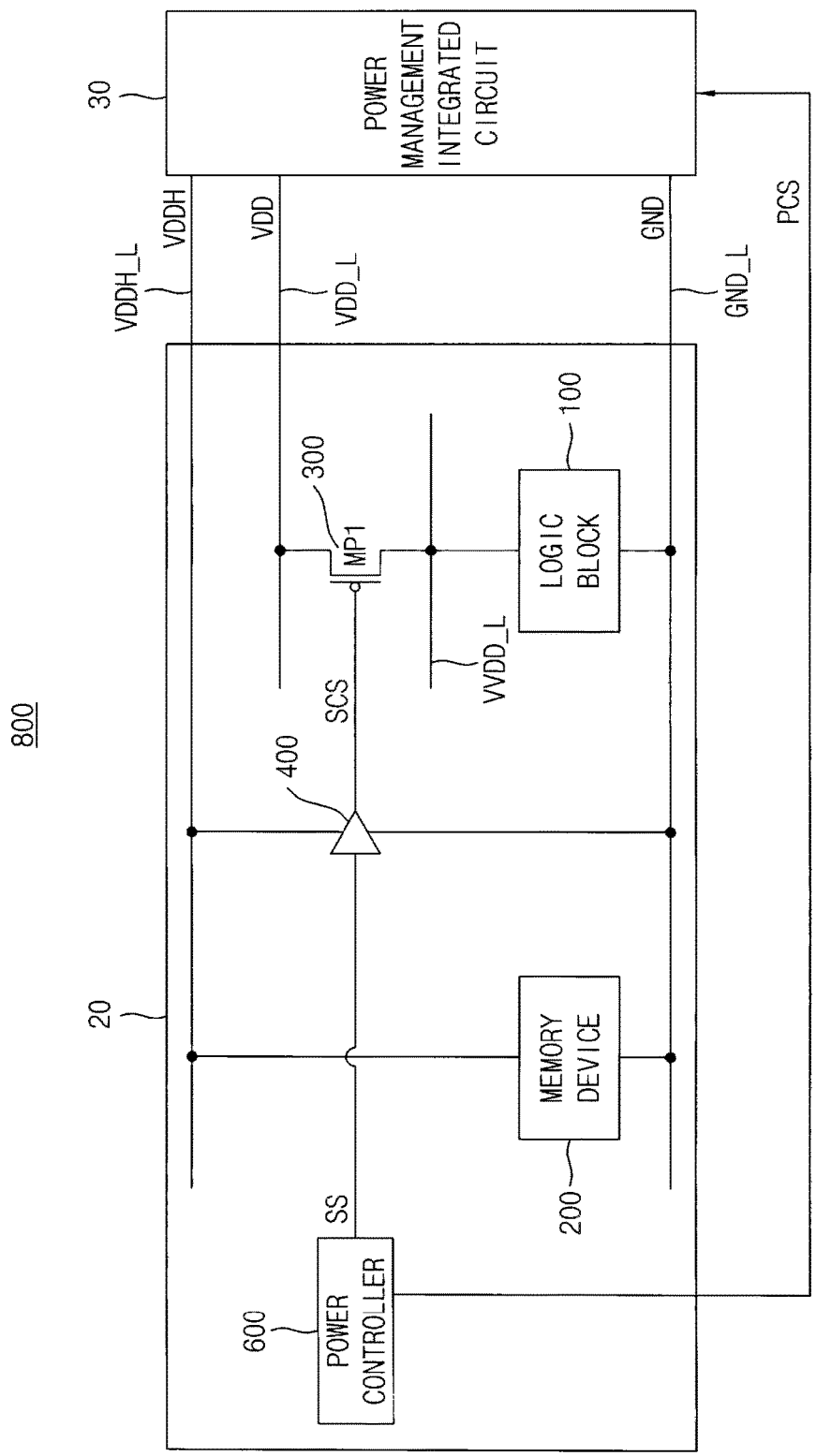
FIG. 6 is a block diagram illustrating an electronic device according to exemplary embodiments.

FIG. 6 is a block diagram illustrating an electronic device according to exemplary embodiments.

Referring to FIG. 6, an electronic device 800 includes a system-on-chip 20 and a power management integrated circuit 30.

The power management integrated circuit 30 may be coupled to the system-on-chip 20 through the first power supply line VDD_L, the second power supply line VDDH_L, and the ground line GND_L. The power management integrated circuit 30 may apply a first power supply voltage VDD to the first power supply line VDD_L, apply a second power supply voltage VDDH to the second power supply line VDDH_L, and apply a ground voltage GND to the ground line GND_L. The ground voltage GND may be a 0 voltage. Alternatively, in some exemplary embodiments, the ground voltage GND may be non-zero. In addition, the power management integrated circuit 30 may adjust at least one of a magnitude of the first power supply voltage VDD and a magnitude of the second power supply voltage VDDH based on a power control signal PCS provided by the system-on-chip 20.

The system-on-chip 20 may operate using the first power supply voltage VDD, the second power supply voltage VDDH, and the ground voltage GND provided by the power management integrated circuit 30 through the first power supply line VDD_L, the second power supply line VDDH_L, and the ground line GND_L, respectively.

In some exemplary embodiments, the system-on-chip 20 may be, for example, an application processor, a media processor, a microprocessor, a central processing unit (CPU), etc.

The system-on-chip 20 may include a logic block 100, a memory device 200, a power switch 300, a buffer 400, and a power controller 600.

The power switch 300 may be coupled between the first power supply line VDD_L and a virtual power supply line VVDD_L. The power switch 300 may be turned on in response to a switch control signal SCS.

The logic block 100 may be coupled between the virtual power supply line VVDD_L and the ground line GND_L.

The memory device 200 may be coupled between the second power supply line VDDH_L and the ground line GND_L. In some exemplary embodiments, the memory device 200 may be a static random access memory (SRAM) device.

The buffer 400 may be coupled between the second power supply line VDDH_L and the ground line GND_L. The buffer 400 may generate the switch control signal SCS based on a sleep signal SS. For example, the buffer 400 may generate the switch control signal SCS by buffering the sleep signal SS.

The logic block 100, the memory device 200, the power switch 300, and the buffer 400 included in the system-on-chip 20 of FIG. 6 may be the same as the logic block 100, the memory device 200, the power switch 300, and the buffer 400 included in the system-on-chip 10 of FIG. 1. Therefore, repeated descriptions thereof will be omitted.

The power controller 600 may generate the power control signal PCS and the sleep signal SS based on an operation mode of the logic block 100. The power controller 600 may provide the power control signal PCS to the power management integrated circuit 30, and provide the sleep signal SS to the buffer 400.

In some exemplary embodiments, the power controller 600 may directly provide the power control signal PCS to the power management integrated circuit 30 through an external bus coupled to an outside of the system-on-chip 20.

In the normal operation mode in which the logic block 100 is activated, the power controller 600 may provide the sleep signal SS having a second logic level (e.g., a logic low level) to the buffer 400. The buffer 400 may provide the ground voltage GND to the gate of the first PMOS transistor MP1 as the switch control signal SCS based on the sleep signal SS having the second logic level. Therefore, the first PMOS transistor MP1 may be turned on to couple the first power supply line VDD_L to the virtual power supply line VVDD_L. As such, the logic block 100 may receive power from the first power supply line VDD_L to perform a normal operation. The power controller 600 may adjust a value of the power control signal PCS based on a task the system-on-chip 20 performs, and the power management integrated circuit 30 may adjust at least one of the magnitude of the first power supply voltage VDD and the magnitude of the second power supply voltage VDDH based on the value of the power control signal PCS provided by the power controller 600 to decrease power consumption of the electronic device 800 in the normal operation mode.

In the sleep mode in which the logic block 100 is deactivated, the power controller 600 may provide the power control signal PCS having a first value to the power management integrated circuit 30 and provide the sleep signal SS having a first logic level (e.g., a logic high level) to the buffer 400. In the sleep mode in which the power control signal PCS has the first value, the power management integrated circuit 30 may control a voltage level of the first power supply voltage VDD to be lower than a voltage level of the second power supply voltage VDDH. In some exemplary embodiments, the power management integrated circuit 30 may decrease the voltage level of the first power supply voltage VDD when entering in the sleep mode, such that the voltage level of the first power supply voltage VDD may be maintained to be lower than the voltage level of the second power supply voltage VDDH in the sleep mode. The buffer 400 may provide the second power supply voltage VDDH to the gate of the first PMOS transistor MP1 as the switch control signal SCS based on the sleep signal SS having the first logic level. Since the second power supply voltage VDDH is applied to the gate of the first PMOS transistor MP1 and the first power supply voltage VDD, which is lower than the second power supply voltage VDDH, is applied to the source of the first PMOS transistor MP1, the first PMOS transistor MP1 may be turned off. In addition, since the voltage difference between the gate and the source of the first PMOS transistor MP1 corresponds to the voltage difference between the second power supply voltage VDDH and the first power supply voltage VDD, a leakage current that flows through the first PMOS transistor MP1 when the first PMOS transistor MP1 is turned off in the sleep mode may decrease. Therefore, the electronic device 800 according to exemplary embodiments may effectively decrease power consumption in the sleep mode.

In some exemplary embodiments, the power controller 600 may adjust the value of the power control signal PCS using software. For example, the power controller 600 may monitor a task that the logic block 100 performs using the software. When the logic block 100 does not perform a task, the software may set the value of the power control signal PCS to the first value to operate the logic block 100 in the sleep mode. When the logic block 100 performs a task, the software may adjust the value of the power control signal PCS based on an operation speed of the task. For example, as the operation speed of the task increases, the software may increase the value of the power control signal PCS. When the value of the power control signal PCS increases in the normal operation mode, the power management integrated circuit 30 may increase at least one of the magnitude of the first power supply voltage VDD and the magnitude of the second power supply voltage VDDH. Alternately, when the value of the power control signal PCS decreases in the normal operation mode, the power management integrated circuit 30 may decrease at least one of the magnitude of the first power supply voltage VDD and the magnitude of the second power supply voltage VDDH. As described above, since the power controller 600 controls the power management integrated circuit 30 to generate the first power supply voltage VDD and the second power supply voltage VDDH having an optimum voltage level based on a task the logic block 100 performs, the power consumption of the electronic device 800 may effectively decrease.

In addition, since the power management integrated circuit 30 provides the first power supply voltage VDD and the second power supply voltage VDDH to the system-on-chip 20 through the first power supply line VDD_L and the second power supply line VDDH_L, respectively, and the buffer 400 is coupled to the second power supply line VDDH_L, the buffer 400 may provide the second power supply voltage VDDH, which is higher than the first power supply voltage VDD applied to the source of the first PMOS transistor MP1, to the gate of the first PMOS transistor MP1 based on the sleep signal SS without using a separate level shifter in the sleep mode. Therefore, the system-on-chip 20 according to exemplary embodiments may be implemented in a relatively small size compared to a system-on-chip including a level shifter, such that a size of the electronic device 800 may also decrease.

Figure 7:
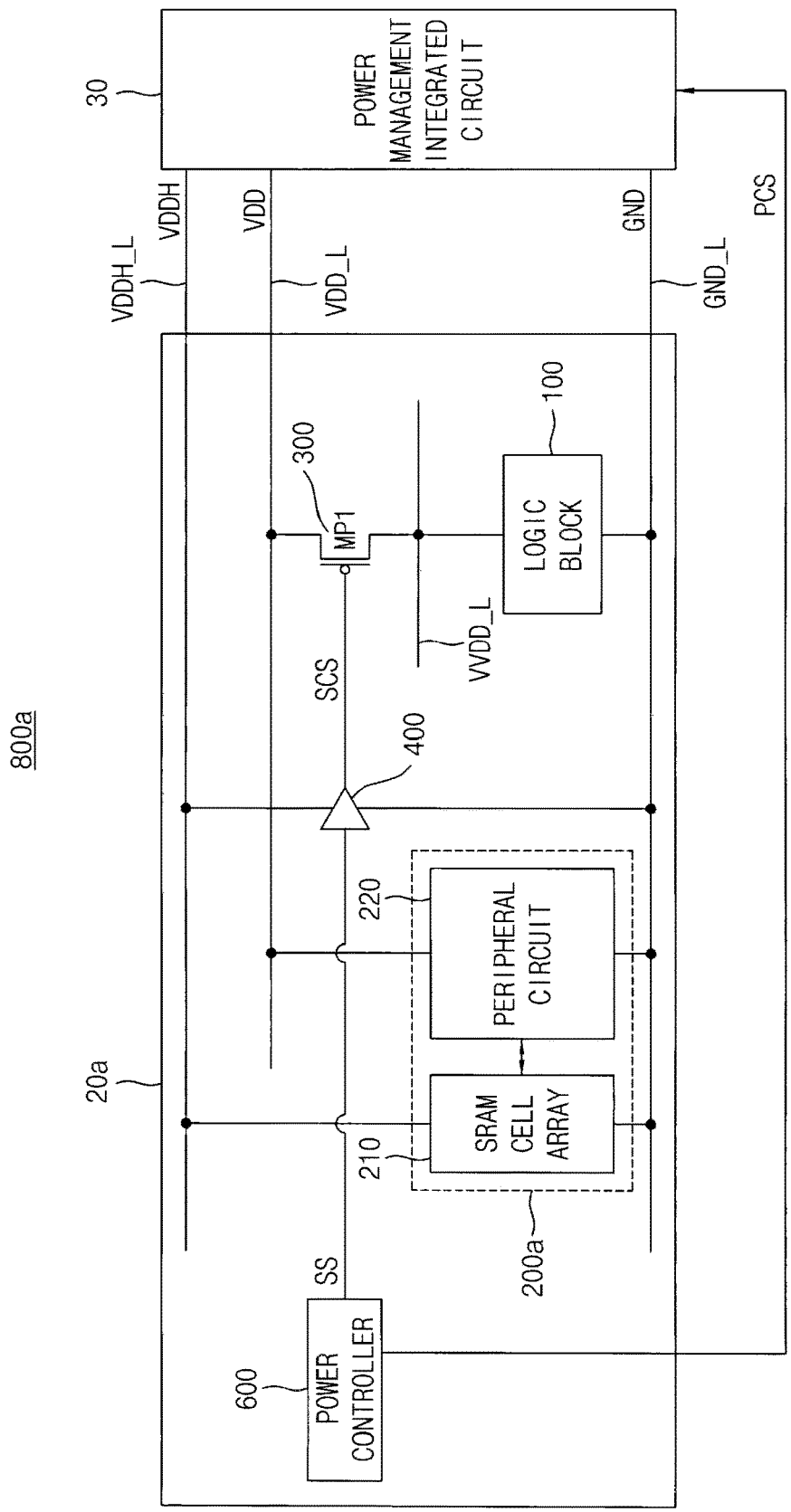
FIG. 7 is a block diagram illustrating another example of the electronic device of FIG. 6.

FIG. 7 is a block diagram illustrating another example of the electronic device of FIG. 6.

Referring to FIG. 7, an electronic device 800a may include a system-on-chip 20a and a power management integrated circuit 30.

The power management integrated circuit 30 included in the electronic device 800a of FIG. 7 may be the same as the power management integrated circuit 30 included in the electronic device 800 of FIG. 6. Therefore, repeated description thereof will be omitted.

The system-on-chip 20a may include a logic block 100, a memory device 200a, a power switch 300, a buffer 400, and a power controller 600.

The logic block 100, the power switch 300, the buffer 400, and the power controller 600 included in the system-on-chip 20a of FIG. 7 may be the logic block 100, the power switch 300, the buffer 400, and the power controller 600 included in the system-on-chip 20 of FIG. 6. Therefore, repeated description thereof will be omitted.

The memory device 200a may be an SRAM device including an SRAM cell array 210 and a peripheral circuit PERI 220.

The SRAM cell array 210 may be coupled between the second power supply line VDDH_L and the ground line GND_L. Therefore, the SRAM cell array 210 may operate using the second power supply voltage VDDH provided through the second power supply line VDDH_L.

The SRAM cell array 210 may be coupled to the peripheral circuit 220 through a plurality of word lines, a plurality of bit lines, and a plurality of complementary bit lines. The SRAM cell array 210 may include a plurality of bitcells coupled to the plurality of word lines, the plurality of bit lines, and the plurality of complementary bit lines. For example, each of the plurality of bitcells may be implemented with the bitcell 211 of FIG. 4. The bitcell 211 illustrated in FIG. 4 is an example of the bitcell included in the SRAM cell array 210 of FIG. 7, but exemplary embodiments are not limited thereto. The bitcell included in the SRAM cell array 210 may be implemented in various structures that store one bit data.

The peripheral circuit 220 may be coupled between the first power supply line VDD_L and the ground line GND_L. Therefore, the peripheral circuit 220 may operate using the first power supply voltage VDD provided through the first power supply line VDD_L.

The peripheral circuit 220 may control an operation of the SRAM cell array 210 through the plurality of word lines, the plurality of bit lines, and the plurality of complementary bit lines. For example, the peripheral circuit 220 may control a write operation and a read operation of the SRAM cell array 210. In some exemplary embodiments, the peripheral circuit 220 may include a row decoder, a column decoder, a sense amplifier, a data input/output buffer, etc.

Generally, if a voltage level of a power supply voltage that is provided to a semiconductor device decreases, power consumption of the semiconductor device decreases. However, the voltage level of the power supply voltage is required to be greater than a threshold magnitude for the semiconductor device to operate stably. The threshold magnitude may be predetermined. If the voltage level of the power supply voltage is smaller than the threshold magnitude, an error may occur in the operation of the semiconductor device.

In the case of the memory device 200a, the peripheral circuit 220 may operate stably although the power supply voltage is relatively low, but the SRAM cell array 210 may use a relatively high power supply voltage to operate stably. For example, referring to the bitcell 211 of FIG. 4, threshold voltages of the first through fourth transistors M1~M4 may have variations according to manufacturing processes. Therefore, if a voltage level of the second power supply voltage VDDH, which is provided through the second power supply line VDDH_L, decreases such that a voltage difference between the second power supply voltage VDDH and the ground voltage GND decreases, a state of data stored in the bitcell 211 may be changed.

As described above with reference to FIG. 7, in the memory device 200a included in the system-on-chip 20a, the peripheral circuit 220 may be coupled between the first power supply line VDD_L, to which the first power supply voltage VDD is applied, and the ground line GND_L to decrease power consumption, and the SRAM cell array 210 may be coupled between the second power supply line VDDH_L, to which the second power supply voltage VDDH higher than the first power supply voltage VDD is applied, and the ground line GND_L to operate stably.

Therefore, the electronic device 800a of FIG. 7 may decrease power consumption while operating stably in the sleep mode.

Figure 8:
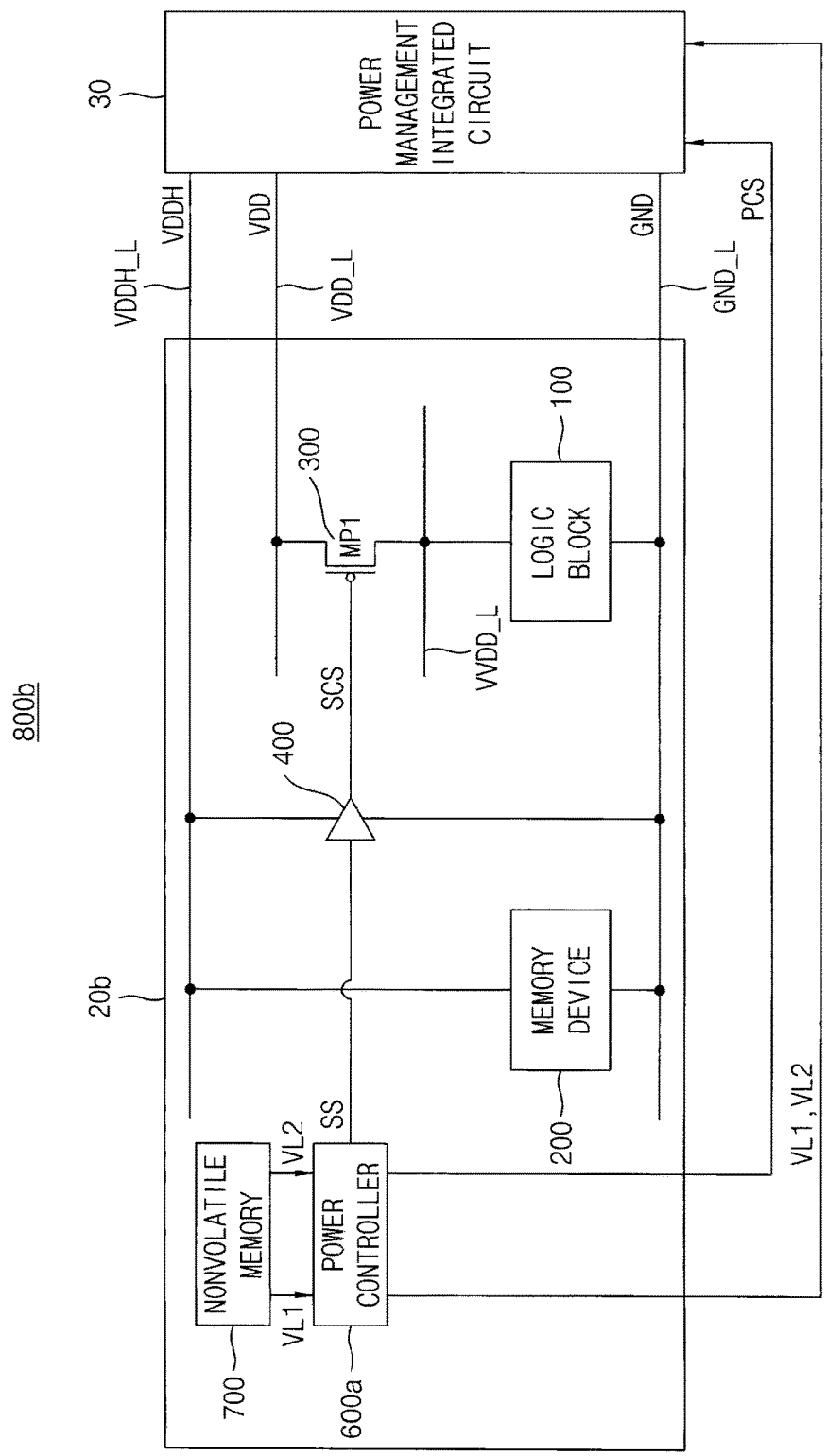
FIG. 8 is a block diagram illustrating another example of the electronic device of FIG. 6.

FIG. 8 is a block diagram illustrating another example of the electronic device of FIG. 6.

Referring to FIG. 8, an electronic device 800b may include a system-on-chip 20b and a power management integrated circuit 30.

The power management integrated circuit 30 included in the electronic device 800b of FIG. 8 may be the same as the power management integrated circuit 30 included in the electronic device 800 of FIG. 6. Therefore, repeated description thereof will be omitted.

The system-on-chip 20b may include a logic block 100, a memory device 200, a power switch 300, a buffer 400, a power controller 600a, and a non-volatile memory 700.

The logic block 100, the memory device 200, the power switch 300, and the buffer 400 included in the system-on-chip 20b of FIG. 8 may be the logic block 100, the memory device 200, the power switch 300, and the buffer 400 included in the system-on-chip 20 of FIG. 6. Therefore, repeated description thereof will be omitted.

The non-volatile memory 700 may store a first voltage level VL1 and a second voltage level VL2 that is higher than the first voltage level VL1. Alternatively, in some exemplary embodiments, the non-volatile memory 700 may store information indicating a first voltage level VL1 and information indicating a second voltage level VL2. The information may be a voltage level or a code or other such information. For example, the information may be a low voltage level or low voltage levels that are then multiplied by a multiplier or multipliers to achieve the first voltage level VL1 and the second voltage level VL2. As another example, the code may be a code indicating the first voltage level VL1 and a code indicating the second voltage level VL2. In some exemplary embodiments, the non-volatile memory 700 may include a one time programmable (OTP) memory. However, exemplary embodiments are not limited thereto, and the non-volatile memory 700 may be implemented with various kinds of non-volatile memories.

The power controller 600a may provide the first voltage level VL1 and the second voltage level VL2 or the information indicating the first voltage level VL1 and the information indicating the second voltage level VL2, which are stored in the non-volatile memory 700, to the power management integrated circuit 30 together with the power control signal PCS having the first value when entering in the sleep mode. In some exemplary embodiments, the power controller 600a may read the first voltage level VL1 and the second voltage level VL2, or the information indicating the first voltage level VL1 and the information indicating the second voltage level VL2, from the non-volatile memory 700 at an initial stage of power-up, and store the first voltage level VL1 and the second voltage level VL2, or the information indicating the first voltage level VL1 and the information indicating the second voltage level VL2, in an internal register. When the logic block 100 enters from the normal operation mode to the sleep mode, the power controller 600a may provide the first voltage level VL1 and the second voltage level VL2 or the information indicating the first voltage level VL1 and the information indicating the second voltage level VL2, which are stored in the internal register, to the power management integrated circuit 30 together with the power control signal PCS having the first value.

When the power management integrated circuit 30 receives the power control signal PCS having the first value, the first voltage level VL1, and the second voltage level VL2 (or the information indicating the first voltage level VL1 and the information indicating the second voltage level VL2) from the power controller 600a, the power management integrated circuit 30 may set the first power supply voltage VDD, which is applied to the first power supply line VDD_L, to the first voltage level VL1 or may set the first power supply voltage VDD based on the information indicating the first voltage level VL1, and may set the second power supply voltage VDDH, which is applied to the second power supply line VDDH_L, to the second voltage level VL2 or may set the second power supply voltage VDDH based on the information indicating the second voltage level VL2. In the case of using the information indicating the first voltage level VL1 and the information indicating the second voltage level VL2, the power management integrated circuit 30 may multiply the information indicating the first voltage level VL1 and the information indicating the second voltage level VL2 by one or more respective multipliers to arrive at the first power supply voltage VDD and the second power supply voltage VDDH. In the case the information is a code, the power management integrated circuit 30 may determine the first power supply voltage VDD and the second power supply voltage VDDH based on the respective codes.

In some exemplary embodiments, the first voltage level VL1 and the second voltage level VL2, or the information indicating the first voltage level VL1 and the information indicating the second voltage level VL2, which are stored in the non-volatile memory 700, may be determined during the process of testing the system-on-chip 20b.

As described above, since the second power supply voltage VDDH is applied to the gate of the first PMOS transistor MP1 and the first power supply voltage VDD, which is lower than the second power supply voltage VDDH, is applied to the source of the first PMOS transistor MP1, as the voltage difference between the second power supply voltage VDDH and the first power supply voltage VDD increases, the leakage current flowing through the first PMOS transistor MP1 in the sleep mode may decrease.

However, if the second power supply voltage VDDH is too high, a leakage current may flow in the buffer 400. For example, as described above with reference with FIG. 2, the body of the first PMOS transistor MP1, which is included in the power switch 300, and the bodies of the second PMOS transistor MP2 and the third PMOS transistor MP3, which are included in the buffer 400, may be commonly coupled to the first power supply line VDD_L, such that the first PMOS transistor MP1, the second PMOS transistor MP2, and the third PMOS transistor MP3 may be formed on a same well. In this case, since the first power supply voltage VDD is applied to the bodies of the second PMOS transistor MP2 and the third PMOS transistor MP3, and the second power supply voltage VDDH, which is higher than the first power supply voltage VDD, is applied to the source of the second PMOS transistor MP2 and the third PMOS transistor MP3 in the sleep mode, a forward biasing condition may be established in the second PMOS transistor MP2 and the third PMOS transistor MP3 such that a leakage current may flow in the second PMOS transistor MP2 and the third PMOS transistor MP3.

Therefore, the leakage current of the power switch 300 and the leakage current of the buffer 400 may be measured while adjusting voltage levels of the first power supply voltage VDD and the second power supply voltage VDDH in the sleep mode, and the voltage level of the first power supply voltage VDD and the voltage level of the second power supply voltage VDDH may be determined as the first voltage level VL1 and the second voltage level VL2, respectively, when a sum of the leakage current of the power switch 300 and the leakage current of the buffer 400 is minimized.

Figure 9:
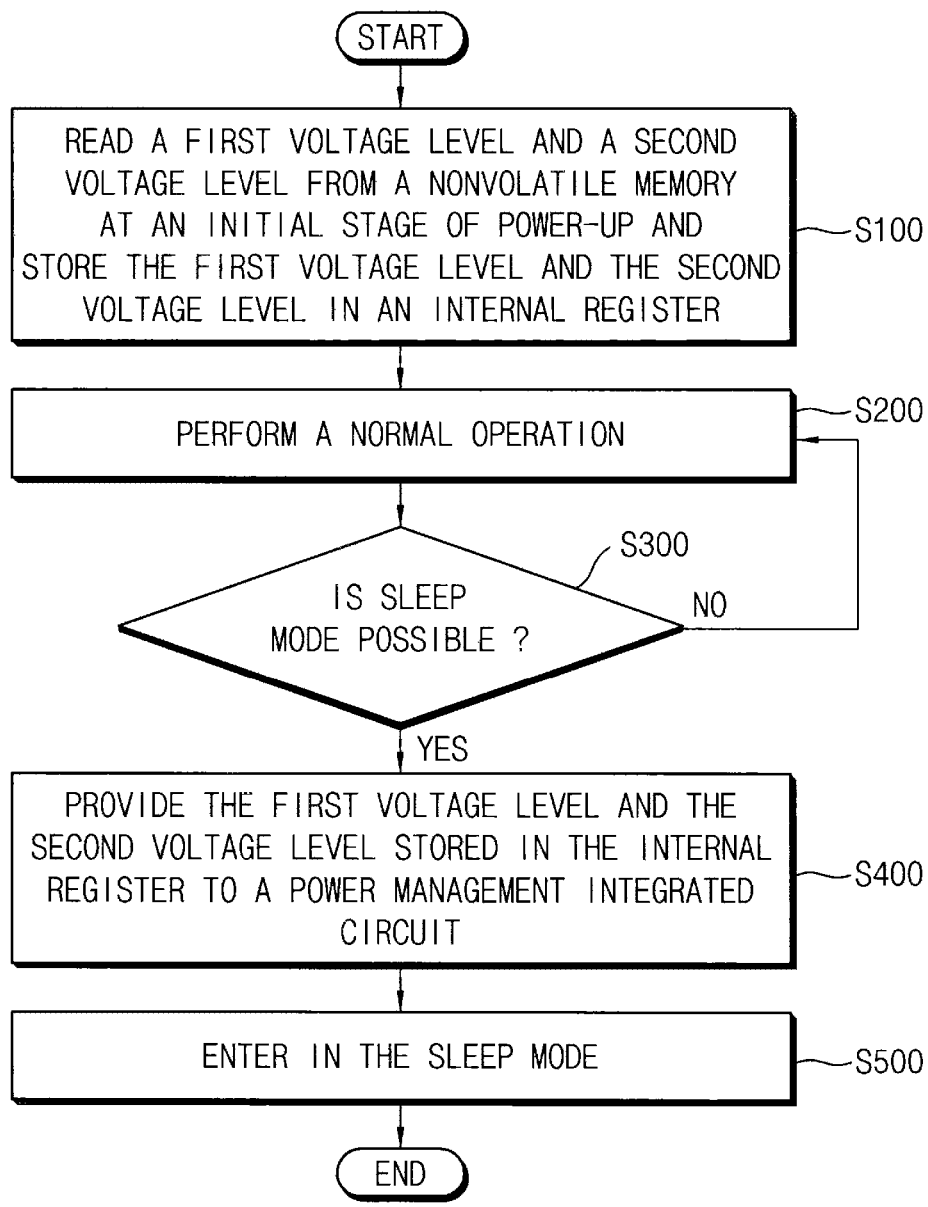
FIG. 9 is a flow chart illustrating an operation of the electronic device of FIG. 8.

FIG. 9 is a flow chart illustrating an operation of the electronic device of FIG. 8.

Referring to FIGS. 8 and 9, the power controller 600a may read the first voltage level VL1 and the second voltage level VL2 from the non-volatile memory 700 at an initial stage of power-up, and store the first voltage level VL1 and the second voltage level VL2 in the internal register (operation S100). After that, the electronic device 800b may perform a normal operation in the normal operation mode (i.e., a non-sleep mode) (operation S200).

In the normal operation mode, the power controller 600a may periodically or aperiodically determine whether sleep mode is possible (operation S300). For example, the power controller 600a may periodically or aperiodically determine whether the logic block 100 is deactivated such that the logic block 100 may be able to enter in the sleep mode.

When the logic block 100 is unable to enter in the sleep mode (operation S300; NO), the electronic device 800b may keep performing the normal operation in the normal operation mode (operation S200).

When the logic block 100 is able to enter in the sleep mode (operation S300; YES), the power controller 600a may provide the first voltage level VL1 and the second voltage level VL2, which are stored in the internal register, to the power management integrated circuit 30 (operation S400). The power controller 600a may provide the first voltage level VL1 and the second voltage level VL2 to the power management integrated circuit 30 together with the power control signal PCS having the first value. In addition, the power controller 600a may provide the sleep signal SS having the first logic level to the buffer 400.

Therefore, the first power supply voltage VDD having the first voltage level VL1 may be applied to the source of the first PMOS transistor MP1, and the second power supply voltage VDDH having the second voltage level VL2, which is higher than the first voltage level VL1, may be applied to the gate of the first PMOS transistor MP1. As such, the first PMOS transistor MP1 may be turned off and the first power supply line VDD_L may be disconnected from the virtual power supply line VVDD_L. Therefore, the logic block 100 may enter in the sleep mode (operation S500).

As described above with reference to FIGS. 8 and 9, in the electronic device 800b according to exemplary embodiments, the non-volatile memory 700 may store the voltage level of the first power supply voltage VDD and the voltage level of the second power supply voltage VDDH as the first voltage level VL1 and the second voltage level VL2, respectively, where the voltage levels are voltage levels at which a sum of the leakage current of the power switch 300 and the leakage current of the buffer 400 is minimized in the sleep mode, and the power management integrated circuit 30 may set the first power supply voltage VDD to the first voltage level VL1 and set the second power supply voltage VDDH to the second voltage level VL2 when entering in the sleep mode. Therefore, the electronic device 800b may further decrease the power consumption in the sleep mode.

Figure 10:
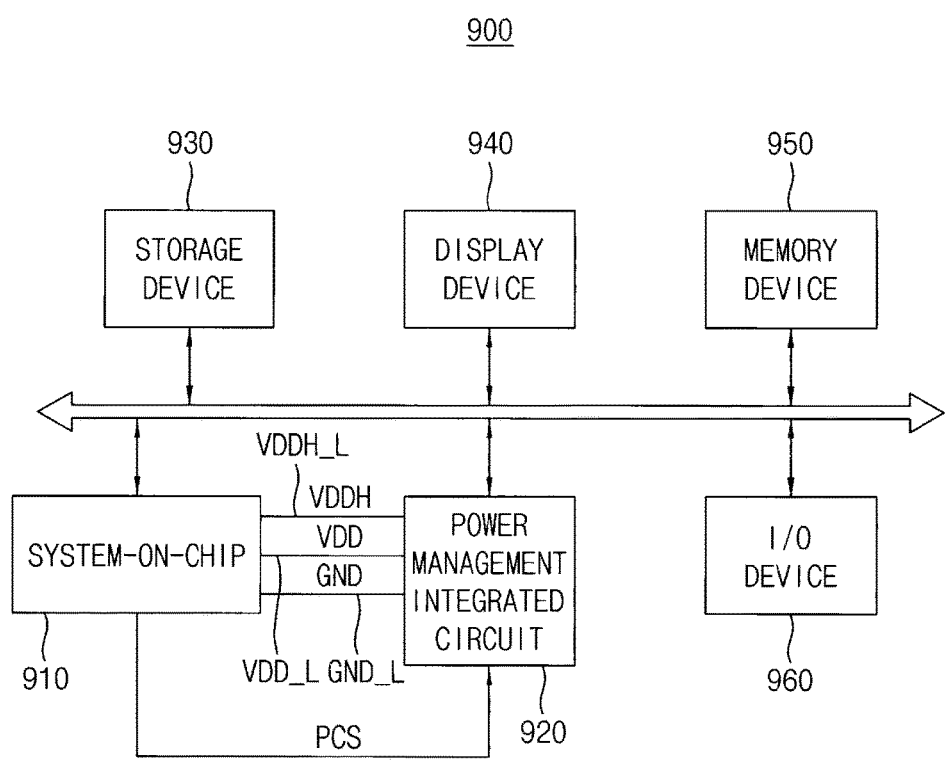
FIG. 10 is a block diagram illustrating a computing system according to exemplary embodiments.

FIG. 10 is a block diagram illustrating a computing system according to exemplary embodiments.

Referring to FIG. 10, a computing system 900 includes a system-on-chip 910, a power management integrated circuit 920, a storage device 930, a display device 940, a memory device 950, and an input/output (I/O) device 960.

The power management integrated circuit 920 is coupled to the system-on-chip 910 through a first power supply line VDD_L, a second power supply line VDDH_L, and a ground line GND_L. The power management integrated circuit 920 may apply a first power supply voltage VDD to the first power supply line VDD_L, apply a second power supply voltage VDDH to the second power supply line VDDH_L, and apply a ground voltage GND to the ground line GND_L. In addition, the power management integrated circuit 920 may adjust at least one of a magnitude of the first power supply voltage VDD and a magnitude of the second power supply voltage VDDH based on a power control signal PCS provided by the system-on-chip 910.

The system-on-chip 910 controls overall operations of the computing system 900. The system-on-chip 910 may operate using the first power supply voltage VDD, the second power supply voltage VDDH, and the ground voltage GND provided by the power management integrated circuit 920 through the first power supply line VDD_L, the second power supply line VDDH_L, and the ground line GND_L, respectively.

The system-on-chip 910 and the power management integrated circuit 920 included in the computing system 900 of FIG. 10 may be implemented with the system-on-chip 20 and the power management integrated circuit 30 included in the electronic device 800 of FIG. 6. The structure and the operation of the system-on-chip 20 and the power management integrated circuit 30 included in the electronic device 800 of FIG. 6 are described above with reference to FIGS. 1 to 9. Therefore, repeated descriptions of the system-on-chip 910 and the power management integrated circuit 920 will be omitted here.

The storage device 930 stores multimedia data. The storage device 930 may include, for example, a non-volatile memory device such as a flash memory device, a solid state drive (SSD), etc.

The system-on-chip 910 may read the multimedia data from the storage device 930 and generate video data based on the multimedia data. The system-on-chip 910 may provide the video data to the display device 940.

The display device 940 may display the video data received from the system-on-chip 910. In some exemplary embodiments, the display device 940 may include, for example, a liquid crystal display (LCD) device, an organic light emitting diode (OLED) display device, etc.

The memory device 950 stores data required for an operation of the computing system 900. The memory device 950 may include, for example, a volatile memory device such as a dynamic random access memory (DRAM), a static random access memory (SRAM), etc.

The input/output (I/O) device 960 may include an input device such as a touch screen, a keypad, etc., and an output device such as a speaker.

Although it is not illustrated in FIG. 10, the computing system 900 may further include ports that communicate with a video card, a sound card, a memory card, a universal serial bus (USB) device, or other electronic devices.

The system-on-chip 910 may communicate with the storage device 930, the memory device 950, and the input/output device 960 via an address bus, a control bus, and/or a data bus. In some exemplary embodiments, the system-on-chip 910 may be coupled to an extended bus, such as a peripheral component interconnection (PCI) bus.

The computing system 900 may be any computing system including the system-on-chip 910 and the power management integrated circuit 920. For example, the computing system 900 may include a digital camera, a mobile phone, a smart phone, a laptop computer, a portable multimedia player (PMP), a personal digital assistant (PDA), etc.

The computing system 900 and/or components of the computing system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The foregoing is illustrative of the present inventive concept and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A system-on-chip comprising:
a power switch on the system-on-chip coupled between a first power supply line and a virtual power supply line, the power switch being configured to turn on in response to a switch control signal;
a logic block coupled between the virtual power supply line and a ground line;
a memory device coupled between a second power supply line that is different than the first power supply line, and the ground line; and
a buffer coupled between the second power supply line and the ground line, the buffer being configured to generate the switch control signal based on a sleep signal,
wherein a first power supply voltage is provided via the first power supply line, and a second power supply voltage that is higher than the first power supply voltage is provided via the second power supply line.

2. The system-on-chip of claim 1, wherein the buffer is configured to provide the second power supply voltage to the power switch as the switch control signal when the sleep signal has a first logic level.

3. The system-on-chip of claim 1, wherein the power switch is configured to selectively couple the first power supply line to the virtual power supply line in response to the switch control signal.

4. The system-on-chip of claim 1, wherein the power switch comprises a first p-type metal oxide semiconductor (PMOS) transistor comprising a source coupled to the first power supply line, a drain coupled to the virtual power supply line, and a gate that receives the switch control signal.

5. The system-on-chip of claim 4, wherein the buffer comprises:
a second PMOS transistor comprising a source coupled to the second power supply line, a drain coupled to the gate of the first PMOS transistor, and a gate;
a first n-type metal oxide semiconductor (NMOS) transistor comprising a source coupled to the ground line, a drain coupled to the gate of the first PMOS transistor, and a gate;
a third PMOS transistor comprising a source coupled to the second power supply line, a drain coupled to the gate of the second PMOS transistor and the gate of the first NMOS transistor, and a gate that receives the sleep signal; and a second NMOS transistor comprising a source coupled to the ground line, a drain coupled to the gate of the second PMOS transistor and the gate of the first NMOS transistor, and a gate that receives the sleep signal.

6. The system-on-chip of claim 1, wherein the memory device is a static random access memory (SRAM) device.

7. The system-on-chip of claim 1, wherein the memory device comprises:
a static random access memory (SRAM) cell array coupled between the second power supply line and the ground line, the SRAM cell array being configured to operate using a second voltage provided through the second power supply line; and
a peripheral circuit coupled between the first power supply line and the ground line, the peripheral circuit being configured to control an operation of the SRAM cell array using a first voltage provided through the first power supply line.

8. The system-on-chip of claim 1, further comprising a power controller configured to provide the sleep signal having a first logic level to the buffer in a sleep mode in which the logic block is deactivated, and to provide the sleep signal having a second logic level to the buffer in a normal operation mode in which the logic block is activated.

9. An electronic device comprising:
a power management integrated circuit configured to apply a first power supply voltage to a first power supply line, to apply a second power supply voltage to a second power supply line that is different than the first power supply line, to apply a ground voltage to a ground line, and to adjust at least one of a first magnitude of the first power supply voltage and a second magnitude of the second power supply voltage based on a power control signal; and
a system-on-chip coupled to the power management integrated circuit through the first power supply line, the second power supply line, and the ground line,
wherein the system-on-chip comprises:
a power switch coupled between the first power supply line and a virtual power supply line, the power switch being configured to turn on in response to a switch control signal;
a logic block coupled between the virtual power supply line and the ground line;
a memory device coupled between the second power supply line and the ground line;
a power controller configured to generate the power control signal and a sleep signal based on an operation mode of the logic block; and
a buffer coupled between the second power supply line and the ground line, the buffer being configured to generate the switch control signal based on the sleep signal,
wherein a first power supply voltage is provided via the first power supply line, and a second power supply voltage that is higher than the first power supply voltage is provided via the second power supply line.

10. The electronic device of claim 9, wherein the power controller is configured to: generate the power control signal having a first value and generate the sleep signal having a first logic level in a sleep mode, in which the logic block is deactivated, and to adjust a value of the power control signal and generate the sleep signal having a second logic level in a normal operation mode, in which the logic block is activated.

11. The electronic device of claim 10, wherein, based on the power control signal, the power management integrated circuit is configured to control a first voltage level of the first power supply voltage to be lower than a second voltage level of the second power supply voltage in the sleep mode.

12. The electronic device of claim 10, wherein, based on the power control signal, the power management integrated circuit is configured control a first voltage level of the first power supply voltage in the sleep mode to be lower than a second voltage level of the first power supply voltage in the normal operation mode.

13. The electronic device of claim 10, wherein the buffer is configured to provide the second power supply voltage to the power switch as the switch control signal when the sleep signal has the first logic level.

14. The electronic device of claim 10, wherein the system-on-chip further comprises:
a non-volatile memory configured to store a first voltage level and a second voltage level that is higher than the first voltage level,
wherein the power controller is configured to provide the first voltage level and the second voltage level, which are read from the non-volatile memory, to the power management integrated circuit in the sleep mode, and
wherein the power management integrated circuit is configured to set the first power supply voltage to the first voltage level and to set the second power supply voltage to the second voltage level in the sleep mode.

15. The electronic device of claim 14, wherein the first voltage level and the second voltage level are determined based on a first leakage current of the power switch and a second leakage current of the buffer in the sleep mode.

16. The electronic device of claim 10, wherein the power controller is configured to adjust the value of the power control signal using software based on a task performed by the logic block.

17. The electronic device of claim 9, wherein the power switch comprises a first p-type metal oxide semiconductor (PMOS) transistor comprising a source coupled to the first power supply line, a drain coupled to the virtual power supply line, and a gate that receives the switch control signal.

18. The electronic device of claim 9, wherein the memory device comprises:
a static random access memory (SRAM) cell array coupled between the second power supply line and the ground line, the SRAM cell array being configured to operate using a second voltage provided through the second power supply line; and
a peripheral circuit coupled between the first power supply line and the ground line, the peripheral circuit being configured to control an operation of the SRAM cell array using a first voltage provided through the first power supply line.

19. A system-on-chip comprising:
a power switch comprising a transistor comprising a source coupled to a first power supply line supplying a first power supply voltage, a drain coupled to a second power supply line supplying a second power supply voltage, and a gate;
a logic block coupled between the second power supply line and a ground line supplying a ground voltage; and
a buffer configured to forward bias the transistor of the power switch to supply power to the logic block in a normal mode, and to reverse bias the transistor of the power switch by applying a voltage higher than the first power supply voltage to the gate of the transistor to disable the power supplied to the logic block in a sleep mode.

* * * * *